United States Patent [19]
Ohhata et al.

[11] Patent Number: 6,075,729
[45] Date of Patent: Jun. 13, 2000

[54] HIGH-SPEED STATIC RANDOM ACCESS MEMORY

[75] Inventors: Kenichi Ohhata, Hachiouji; Fumihiko Arakawa, Tokorozawa; Takeshi Kusunoki, Tachikawa; Hiroaki Nambu, Sagamihara; Kazuo Kanetani, Akishima; Kaname Yamasaki, Kodaira; Keiichi Higeta, Oume, all of Japan

[73] Assignee: Hitachi, Ltd., Tokyo, Japan

[21] Appl. No.: 09/145,161

[22] Filed: Sep. 1, 1998

[30] Foreign Application Priority Data

Sep. 5, 1997 [JP] Japan ................................. 9-257907

[51] Int. Cl.$^7$ ........................................................ G11C 7/00
[52] U.S. Cl. ........................... 365/190; 365/154; 365/203; 365/189.06; 365/189.11
[58] Field of Search ............................. 365/190, 189.06, 365/189.11, 202, 203, 154, 156, 189.01, 129

[56] References Cited

U.S. PATENT DOCUMENTS

| | | | |
|---|---|---|---|
| 5,093,806 | 3/1992 | Tran | 365/189.11 |
| 5,305,259 | 4/1994 | Kim | 365/189.09 |
| 5,781,469 | 7/1998 | Pathak et al. | 365/156 |
| 5,841,704 | 11/1998 | Notomi | 365/189.09 |
| 5,896,330 | 4/1999 | Gibson | 365/201 |

*Primary Examiner*—David Nelms
*Assistant Examiner*—Hoai V. Ho
*Attorney, Agent, or Firm*—Beall Law Offices

[57] ABSTRACT

A semiconductor memory has a plurality of word lines a plurality of bit line pairs and a plurality of memory cells formed at intersection points between the word lines and the bit line pairs. A word decoder generates a word line select signal upon receipt of an address signal and a bit decoder generates a bit line select signal on receiving the address signal. A bit line load circuit receives a signal current from the applicable memory cell, a sense circuit detects an output signal from the bit line load circuit, and a bit line pull-down circuit and a bit line recovery circuit drives the applicable bit lines upon writing data to the memory cell in question. The bit line load circuit and the bit line recovery circuit include pMOS transistors whose drains are connected to the bit lines and whose gates are fed with a control signal, and diodes whose anodes are connected to a first power supply and whose cathodes are connected to sources of the pMOS transistors, the pMOS transistors and the diodes being furnished to each of the bit line pairs. The pMOS transistors are inhibited from conducting while the bit lines are being driven Low by the bit line pull-down circuit during a write cycle, and allowed to conduct during other periods including a read cycle. This constitution shortens the recovery time, implementing a high-speed SRAM with a shortened cycle time.

14 Claims, 16 Drawing Sheets

HIGH-SPEED STATIC RANDOM ACCESS MEMORY

BACKGROUND OF THE INVENTION

The present invention relates to a semiconductor memory and, more particularly, to an SRAM (static random access memory) suitable for high-speed operation.

For its short access time and cycle time, the SRAM is utilized extensively as a cache memory in computer systems. As such, the SRAM constitutes a key component that holds sway on the speed and performance of the computer system. Efforts of research and development have been under way primarily to boost the operating speed of the memory.

FIG. 2 is a circuit diagram of a conventional SRAM memory cell array and a read/write circuit composed of CMOSs.

A memory cell MC0 comprises a flip-flop and transfer MOS transistors MT0 and MT1. The flip-flop has two CMOS inverters connected alternately, one inverter composed of transistors MI0 and MI1; the other inverter made of transistors MI2 and MI3. Bit line loads ML0 and ML1 as well as transistors MR0, MR1 and MEQ constitute a bit line recovery circuit BR which is connected to bit lines. The bit lines are also connected to a bit line pull-down circuit and a sense amplifier SA via switch transistors MY0 and MY1. The bit line pull-down circuit comprises transistors MD0 and MD1.

To read data from a memory cell requires driving High word-line and bit-line select signals (e.g., W0 and YS in FIG. 2) on the word line and bit lines connected to the cell in question. The signals bring the memory cell MC0 into a selected state. Depending on the data stored in the cell, a current (called a memory cell current) flows from either of the bit lines to the memory cell MC0. The current lowers the bit line potential and creates a potential difference between the bit lines B0 and B1. The potential difference is transmitted via the switch transistors MY0 and MY1 to the sense amplifier SA for amplification. In turn, the sense amplifier SA outputs the amplified potential difference as a data output signal DO via an output buffer OB.

To write data to a memory cell involves selecting the cell in question using the above procedure. Depending on the data to be written, one of write signals WD0 and WD1 is driven High. This causes the bit line pull-down circuit to bring either of the bit lines Low, allowing the data to be written to the memory cell.

For conventional SRAMs, the bit line recovery circuit BR is controlled primarily by one of two methods. The first control method involves using transistors ML0 and ML1 as bit line loads for a write operation, and utilizing the bit line recovery circuit BR to recover the bit lines for bit line equalization and write operations. This method is characterized in that it equalizes or recovers the bit lines prior to a word line transition in a read or a write cycle.

Illustratively, as shown in FIG. 3, a control signal CBR is driven Low before the word line W0 is brought High (i.e., into selected state). This causes the transistors MR0, MR1 and MEQ of the bit line recovery circuit BR to conduct, pulling both bit lines B0 and B1 up to a supply voltage VCC in preparation for the next cycle.

In a read operation, the transistors MR0, MR1 and MEQ of the bit line recovery circuit do not conduct, and the transistors ML0 and ML1 work as bit line loads. Generally, high-speed amplification is made possible using a CMOS- or bipolar transistor-based sense amplifier provided the bit line signal amplitude is about 50 mV. If the memory cell current is 100 μA, the equivalent resistance of the transistors ML0 and ML1 should be designed to be about 500 Ω in order to obtain the above-mentioned bit line signal amplitude.

With the first control method in use, the time required for bit line recovery is determined by the gate width of the transistors MR0, MR1 and MEQ of the bit line recovery circuit BR. It follows that designing a sufficient gate width for these transistors will reduce the equivalent resistance (e.g., to about 100 Ω) and shorten the bit line recovery time.

On the other hand, after the write signal WD0 is brought back Low, the control signal CBR of the bit line recovery circuit needs to be driven Low. That is because driving the control signal CBR Low before the write signal WD0 is brought back Low will let a large through current flow from the transistor MR0 past the transistors MY0 and MD0 promoting power dissipation.

A change from the low to the high potential of the control signal CBR must occur earlier than a word line switchover of the next cycle. If the control signal CBR rises later than the word line transition, the bit lines remain equalized even after the transition, which will cause delays in data read-out. For these reasons, the first method requires interposing timing margins between the write signal WD0 and the control signal CBR, and between the control signal CBR and the word line select signal. The presence of such timing margins has made it difficult for conventional SRAMs to shorten the write cycle time.

The second control method for the bit line recovery circuit BR involves using the bit line recovery circuit BR to load the bit lines in a read operation and to recover them in a write operation. As an advantage, this second method has no need for timing margins between the write signal WD0 and the control signal CBR. Because the bit line recovery circuit BR is used as bit line loads, the transistors ML0 and ML1 may be omitted.

With the second control method, as shown in FIG. 4, the control signal CBR is usually at the low potential and is brought High only while the write signal WD0 is being High. Thus even in a read cycle, the transistors MR0, MR1 and MEQ of the bit line recovery circuit BR conduct and work as bit line loads. If the memory cell current is assumed to be as large as its counterpart mentioned above, the equivalent resistance of the transistors MR0 and MR1 should be designed to be about 500 Ω. This means that the second control method requires a longer bit line recovery time than the first method. Thus it is also difficult for the second control method to shorten the write cycle time.

As described, the conventional techniques, be they the first or the second control method above, have had difficulty in shortening the cycle time. Examples utilizing the above-mentioned first control method include an SRAM discussed in the IEEE Journal of Solid-State Circuits, Vol. 28, No. 4, April 1993, pp. 478–483, and semiconductor memories disclosed in Japanese Unexamined Patent Publications Nos. Hei 4-113590 and Hei 4-344393.

The disclosures of the cited patent applications Hei 4-113590 and Hei 4-344393 may appear structurally similar to embodiments of this invention, to be described later. However the semiconductor memory of Japanese Unexamined Patent Publication No. Hei 4-113590 is intended to provide against those pulse width fluctuations of the control signal CBR which are attributable to environmental variations and fabrication irregularities, and does not address the shortening of timing margins for the control signal, which is an object of this invention.

Furthermore, the semiconductor memory of Japanese Unexamined Patent Publication No. Hei 4-344393 is intended to enlarge the bit line signal amplitude at the time of a read operation, and has nothing to offer in terms of shortening the control signal timing margins.

An example utilizing the second control method above includes an SRAM discussed in the IEEE Journal of Solid-State Circuits, Vol. 25, No. 5, October 1990, pp. 1049–1055.

SUMMARY OF THE INVENTION

It is therefore an object of the present invention to overcome the above and other deficiencies and disadvantages of the prior art and to provide a high-speed SRAM wherein timing margins between control signals are shortened so as to reduce the cycle time.

In carrying out the invention and according to one aspect thereof, there is provided a semiconductor memory comprising: a plurality of word lines; a plurality of bit line pairs; a plurality of memory cells formed at points of intersection between the word lines and the bit line pairs; a word decoder for generating a word line select signal upon receipt of an address signal; a bit decoder for generating a bit line select signal upon receipt of the address signal; a bit line load circuit for receiving a signal current from the applicable memory cell; a sense circuit for detecting an output signal from the bit line load circuit; and, a bit line pull-down circuit and a bit line recovery circuit for driving the applicable bit lines at the time of writing data to the memory cell in question; wherein the bit line load circuit and the bit line recovery circuit include PMOS transistors which have drains thereof connected to the bit lines and which have gates thereof fed with a control signal, and diodes which have anodes thereof connected to a first power supply and which have cathodes thereof connected to sources of the PMOS transistors, the pMOS transistors and the diodes being furnished to each of the bit line pairs; and wherein the pMCS transistors are inhibited from conducting while the bit lines are being driven Low by the bit line pull-down circuit during a write cycle, and allowed to conduct during other periods including a read cycle.

In a first preferred structure according to the invention, the bit line load circuit and the bit line recovery circuit may further include a logic circuit which receives a write signal and the bit line select signal and which generates the control signal; wherein the bit line pull-down circuit may comprise nMOS transistors which are furnished to each of the bit line pairs, which have drains thereof connected to the bit lines, which have gates thereof fed with the control signal, and which have sources thereof connected to a second power supply.

In a second preferred structure according to the invention, the logic circuit may be constituted by a switching circuit which has an input terminal thereof fed with the write signal and which has an output terminal thereof connected to the gates of the pMOS and the nMOS transistors, the switching circuit outputting the write signal when the bit line select signal is in a selected state, the switching circuit further having the output thereof fixed to a low potential when the bit line select signal is in an unselected state.

In a third preferred structure according to the invention, the second power supply may be provided by a power supply circuit included in a semiconductor memory chip.

In a fourth preferred structure according to the invention, the power supply circuit may comprise: first bipolar transistors which have collectors thereof connected to the second power supply and which have emitters thereof connected to a third power supply either directly or through resistors; a level shift circuit which has a first terminal thereof connected to the collectors of the first bipolar transistors and which has a second terminal thereof connected to the first power supply; a differential amplifier which is connected interposingly between the first power supply and the third power supply, which has a first terminal thereof connected to a reference voltage and a second terminal thereof connected to the second terminal of the level shift circuit, and which has an output terminal thereof connected to bases of the first bipolar transistors; and a capacitive element connected interposingly between the first power supply and the second power supply.

In a fifth preferred structure according to the invention, either the word decoder or the bit decoder may include an ECL (emitter-coupled logic) circuit.

In a sixth preferred structure according to the invention, the semiconductor memory may further comprise a first, a second and a third element for use if a memory cell array develops a fault, the first element cutting off the supply of power to the memory cell in question, the second element fixing the bit lines to a low power supply potential of the memory cell, the third element severing connection between the anodes of the diodes on the one hand and the first power supply on the other hand.

In a seventh preferred structure according to the invention, the diodes may be replaced by second bipolar transistors which have emitters thereof connected to the sources of the pMOS transistors and which have bases thereof connected to the first power supply.

In an eighth preferred structure according to the invention, the diodes may be constituted by third bipolar transistors which have bases and collectors thereof interconnected.

In a ninth preferred structure according to the invention, the diodes may be constituted by MOS transistors which have gates and drains thereof interconnected.

In a tenth preferred structure according to the invention, the diodes may be constituted by Schottky-barrier diodes.

In an eleventh preferred structure according to the invention, the semiconductor memory wherein the diodes are replaced by the second bipolar transistors may further comprise a first, a second and a third element for use if a memory cell array develops a fault, the first element cutting off the supply of power to the memory cell in question, the second element fixing the bit lines to a low power supply potential of the memory cell, and the third element lowering a base potential of the second bipolar transistors to bring about a cutoff state.

In a twelfth preferred structure according to the invention, the semiconductor memory wherein the second power supply is provided by the power supply circuit included in the semiconductor memory chip may have the power supply circuit comprising: first bipolar transistors which have collectors thereof connected to the second power supply and which have emitters thereof connected to a third power supply either directly or through resistors; a level shift circuit which has a first terminal thereof connected to the collectors of the first bipolar transistors and which has a second terminal thereof connected to a current source; a differential amplifier which is connected interposingly between the first power supply and the third power supply, which has a first terminal thereof connected to a reference voltage and a second terminal thereof connected to the second terminal of the level shift circuit, and which has an output terminal thereof connected to bases of the first bipolar transistors; and a capacitive element connected interposingly between the first power supply and the second power supply; wherein either the word decoder or the bit decoder may include an ECL circuit.

In a thirteenth preferred structure according to the invention, the diodes may be replaced by second bipolar transistors which have emitters thereof connected to the sources of the pMOS transistors and which have bases thereof connected to the first power supply; wherein the bit line load circuit and the bit line recovery circuit may further include a logic circuit which receives a write signal and the bit line select signal and which generates the control signal; wherein the bit line pull-down circuit may comprise nMOS transistors which are furnished to each of the bit line pairs, which have drains thereof connected to the bit lines, which have gates thereof fed with the control signal, and which have sources thereof connected to a second power supply; wherein the second power supply may be provided by a power supply circuit included in a semiconductor memory chip; wherein the power supply circuit may comprise: first bipolar transistors which have collectors thereof connected to the second power supply and which have emitters thereof connected to a third power supply either directly or through resistors; a level shift circuit which has a first terminal thereof connected to the collectors of the first bipolar transistors and which has a second terminal thereof connected to a current source; a differential amplifier which is connected interposingly between the first power supply and the third power supply, which has a first terminal thereof connected to a reference voltage and a second terminal thereof connected to the second terminal of the level shift circuit, and which has an output terminal thereof connected to bases of the first bipolar transistors; and a capacitive element connected interposingly between the first power supply and the second power supply; wherein either the word decoder or the bit decoder may include an ECL circuit; and wherein the semiconductor memory may further comprise a first, a second and a third element for use if a memory cell array develops a fault, the first element cutting off the supply of power to the memory cell in question, the second element fixing the bit lines to a low power supply potential of the memory cell, and the third element lowering a base potential of the second bipolar transistors to bring about a cutoff state.

BRIEF DESCRIPTION OF THE DRAWINGS

Further objects and advantages of this invention will become apparent upon a reading of the following description and appended drawings wherein like reference numerals designate like or corresponding parts and wherein.

DESCRIPTION OF THE PREFERRED EMBODIMENTS

Preferred embodiments of this invention will now be described in detail with reference to the accompanying drawings.

First Embodiment

Figure 1:
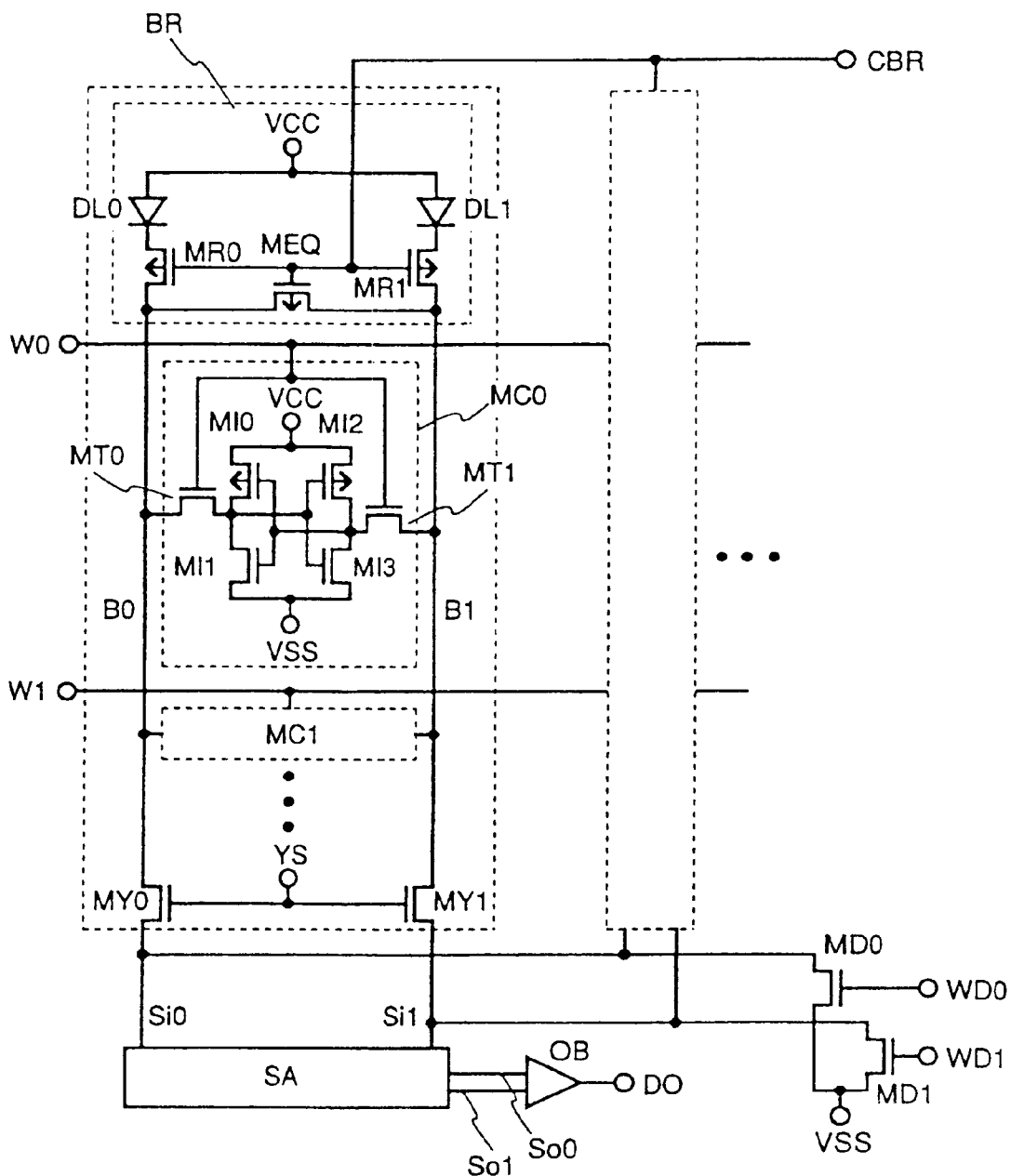
FIG. 1 is a circuit diagram of a semiconductor memory practiced as a embodiment of the invention.
Figure 2:
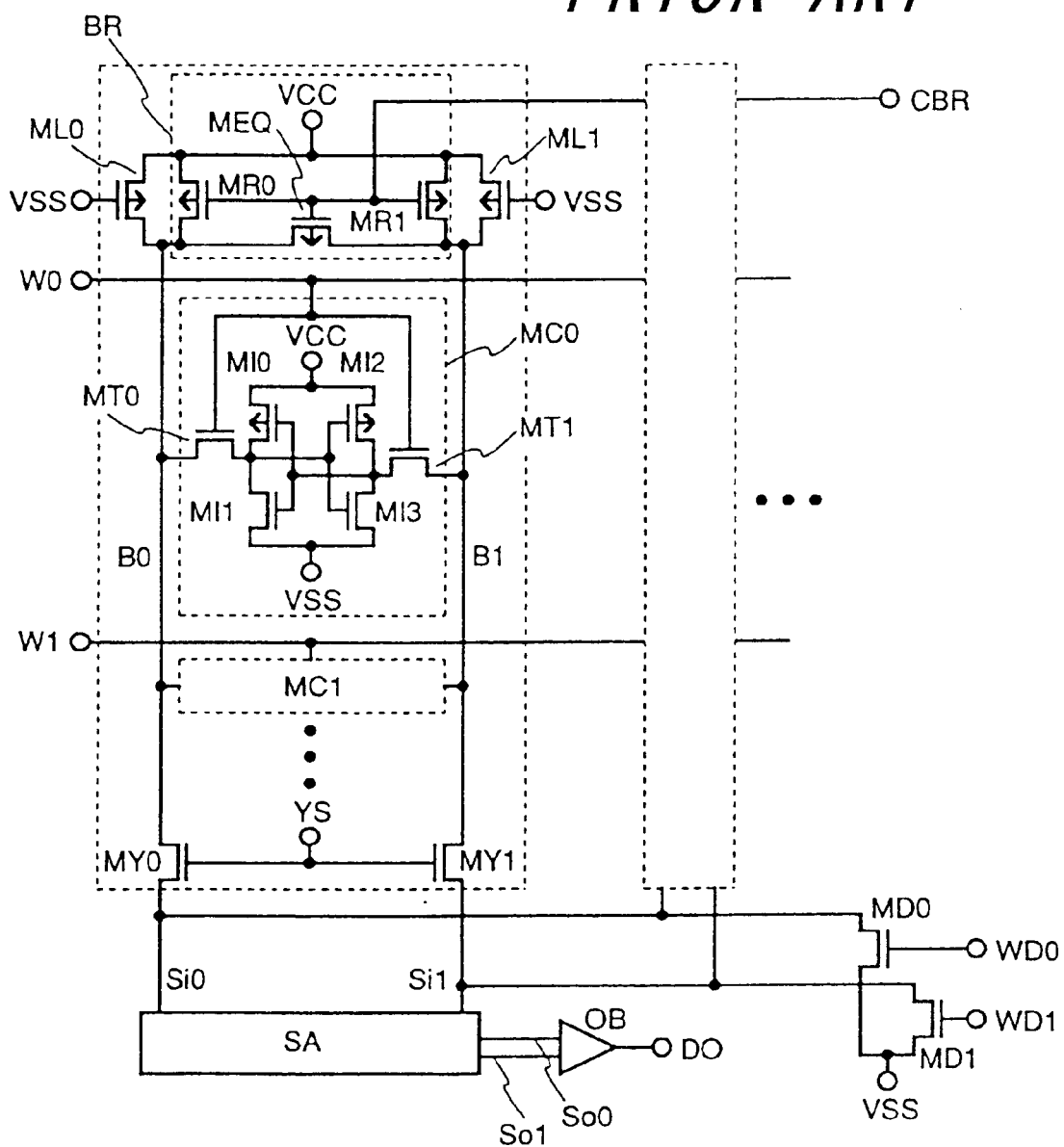
FIG. 2 is a circuit diagram of a conventional semiconductor memory.

FIG. 1 is a circuit diagram of a semiconductor memory practiced as the first embodiment of the invention. The difference between this inventive semiconductor memory and a comparable prior art memory lies in a bit line recovery circuit BR. The bit line recovery circuit BR of the first embodiment doubles as a bit line load circuit. That is, this bit line recovery circuit BR comprises pMOS transistors MR0, MR1 and MEQ; and diodes DL0 and DL1.

Figure 4:
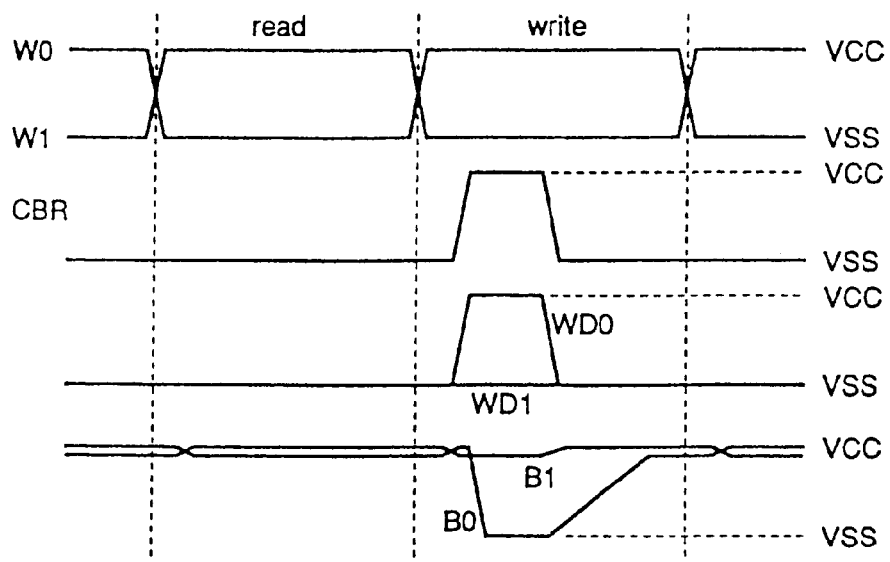
FIG. 4 is an operation waveform chart showing how another conventional device operates.
Figure 5:
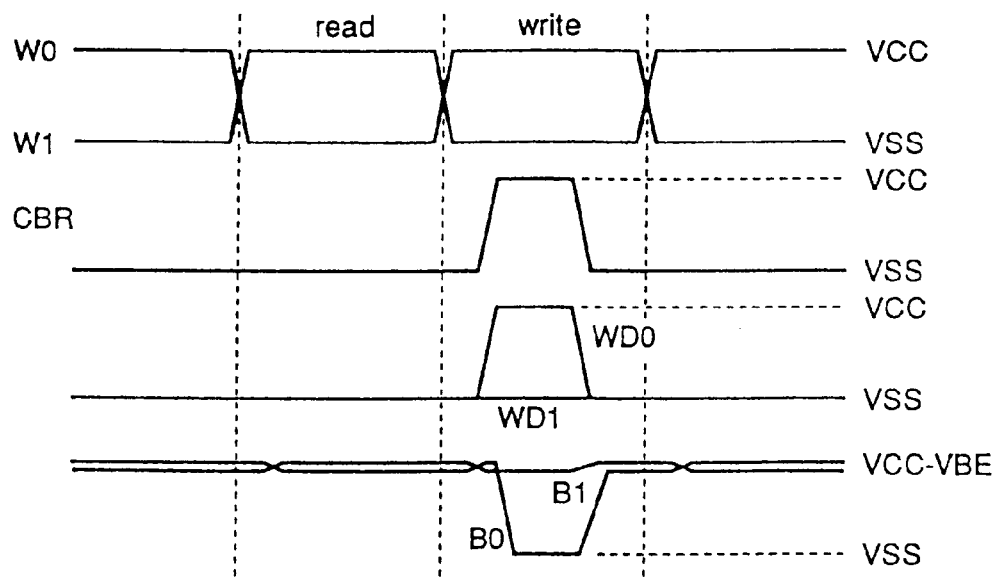
FIG. 5 is an operation waveform chart indicating how the inventive circuit of FIG. 1 operates.

The first embodiment has its bit line recovery circuit controlled by the second control method discussed above in connection with the prior art (see FIG. 4). FIG. 5 is an operation waveform chart indicating how the first embodiment of FIG. 1 operates.

The workings of the first embodiment will now be described with reference to FIGS. 1 and 5. In a read cycle, a control signal CBR is held Low, and the transistors MR0, MR1 and MEQ conduct. The diodes DL0 and DL1 as well as the transistors MR0 and MR1 act as bit line loads. It is assumed here that the memory cell current is 100 $\mu$A, of which 90 $\mu$A flows to the transistor MR0 and 10 $\mu$A to the transistor MR1 via the transistor MEQ. It is also assumed that the equivalent resistance of the transistors MR0 and MR1 is 100 $\Omega$ a value sufficient for pulling up the bit lines at an appreciably high speed.

A potential difference $\Delta V_{bit}$ between the bit lines is defined by the following expression:

$$\Delta V_{bit} = \frac{kT}{q} \ln\left(\frac{I_{MR0}}{I_{MR1}}\right) + R_P(I_{MR0} - I_{MR1}) \quad (1)$$

where, k stands for Boatman constant, T for the junction temperature (300K), q for the quantity of electron charges; $I_{MR0}$ and $I_{MR1}$ for currents flowing to the transistors MR0 and MR1 respectively, and $R_p$ for the equivalent resistance of the transistors MR0 and MR1.

The first term in the expression (1) above denotes a potential difference occurring between the diodes (57 mV), and the second term represents a potential difference that develops between the pMOS transistors (8 mV). Consequently, the potential difference $\Delta V_{bit}$ is 65 mV. Potential differences of this magnitude are sufficient for a CMOS- or bipolar transistor-based sense amplifier to effect high-speed amplification.

As described, the first embodiment utilizes not only pMOS transistors but also diodes as loads. This makes it possible to ensure a necessary bit line signal amplitude even where the bit lines are made small enough to be pulled up at high speed.

In a write cycle, a write signal WD0 or WD1 (WD0 in the example of FIG. 5) is driven High at the same time that the control signal CBR is brought High. The operation causes either of the bit lines to be driven Low, allowing data to be written to the memory cell in question.

While the bit line is being driven Low, the transistors MR0, MR1 and MEQ of the bit line recovery circuit do not conduct. That is, a through current is prevented from flowing through the bit lines via these transistors.

Upon completion of the write operation to the memory cell, the write signal WD0 and control signal CBR are brought back Low. This allows a charging current to flow to the bit lines via the diode DL0 and transistor MR0, pulling up the bit line to the supply voltage VCC. At this point, the equivalent resistance Reff of the diode DL0 and transistor MR0 is given by the following expression:

$$R_{eff} = \frac{kT}{qI_D} + R_P \quad (2)$$

where, $I_D$ is the charging current that flows to the diode. The first term in the expression (2) above denotes the equivalent resistance of the diode DL0, and the second term represents the equivalent resistance of the transistor MR0.

Generally, the charging current is on the order of several mA, so that the equivalent resistance of the diode is as low as 10 Ω. As a result, the equivalent resistance in effect while the bit lines are being recovered is approximately the same as the equivalent resistance of the transistor MR0.

Figure 3:
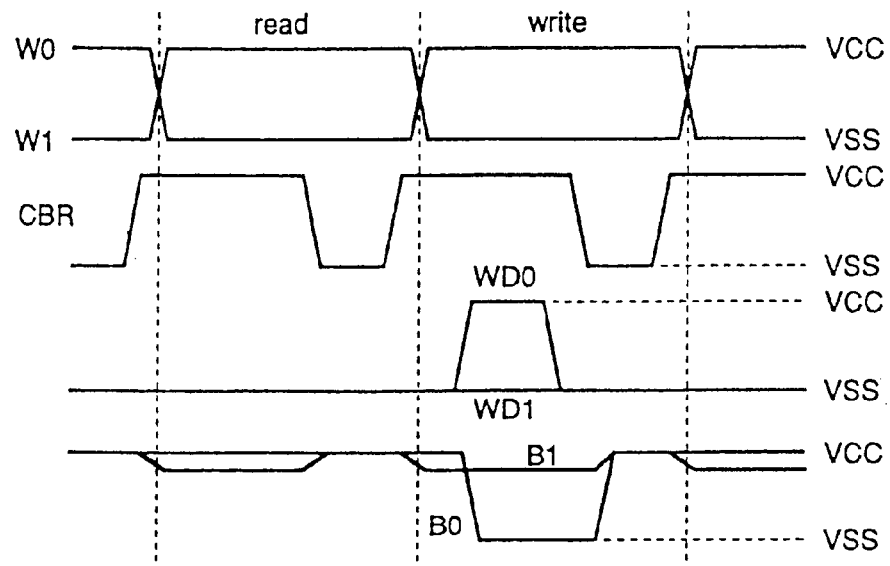
FIG. 3 is an operation waveform chart illustrating how the conventional device of FIG. 2 operates.

As described, the equivalent resistance of the transistors MR0 and MR1 is designed so as to allow the bit lines to be pulled up at a sufficiently high speed. This arrangement renders the recovery time shorter than the second control method of the prior art. Unlike the first control method of the conventional setup (see FIG. 3), there is no need for the first embodiment to have timing margins interposed between the write signal WD0 and the control signal CBR. This makes it possible to shorten the cycle time drastically as opposed to the conventional memory.

The diodes DL0 and DL1 may each be constituted by connecting a base and a collector of a bipolar transistor or by utilizing the pn junction between a source and a well of a MOS transistor. Alternatively, Schottky-barrier diodes may be used. If it is possible to tolerate a slight delay in the recovery at write operations, MOS diodes (with their gates and drains interconnected) may be used instead.

Second Embodiment

Figure 6:
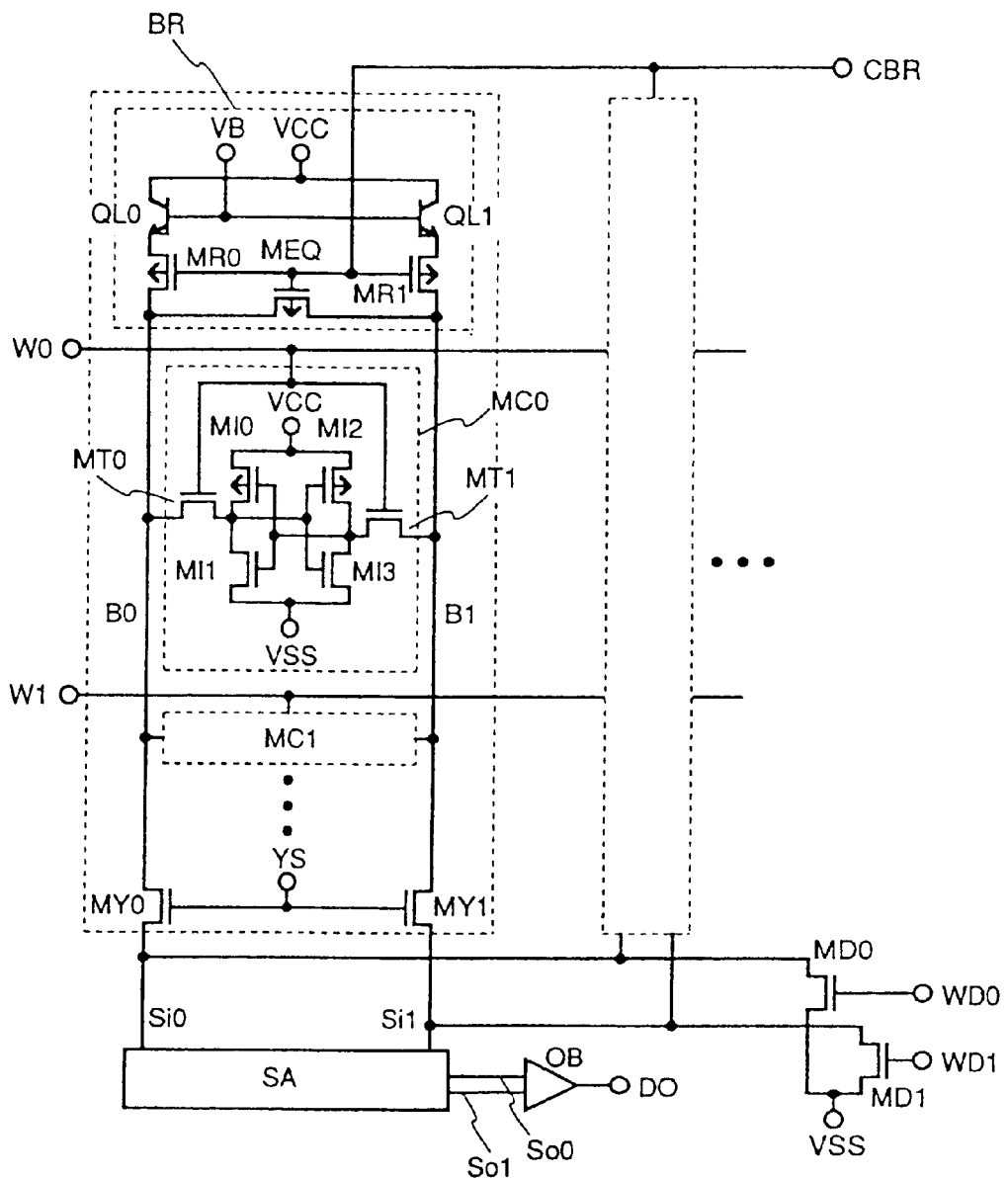
FIG. 6 is a circuit diagram of a semiconductor memory practiced as a second embodiment of the invention.

FIG. 6 is a circuit diagram of a semiconductor memory practiced as the second embodiment of the invention. The diodes DL0 and DL1 in the first embodiment are replaced by bipolar transistors QL0 and QL1 in the second embodiment. The workings of the second embodiment are the same as those of the first embodiment and will not be described further.

In the second embodiment, the use of bipolar transistors permits bit line potential levels to be set as desired for read operations. Specifically, the bit line potential becomes lower than a base potential VB of the bipolar transistors QL0 and QL1 by a base-to-emitter voltage (about 0.8 V). Thus varying the base voltage VB allows the bit line potential to be established as desired.

Illustratively, the bit line potential may be lowered to a minimum level that will not let the memory cell destroy its data upon a read operation. This minimizes the bit line driving amplitude at the time of a write operation, whereby the write operation is performed at high speed and power dissipation is reduced.

Third Embodiment

Figure 7:
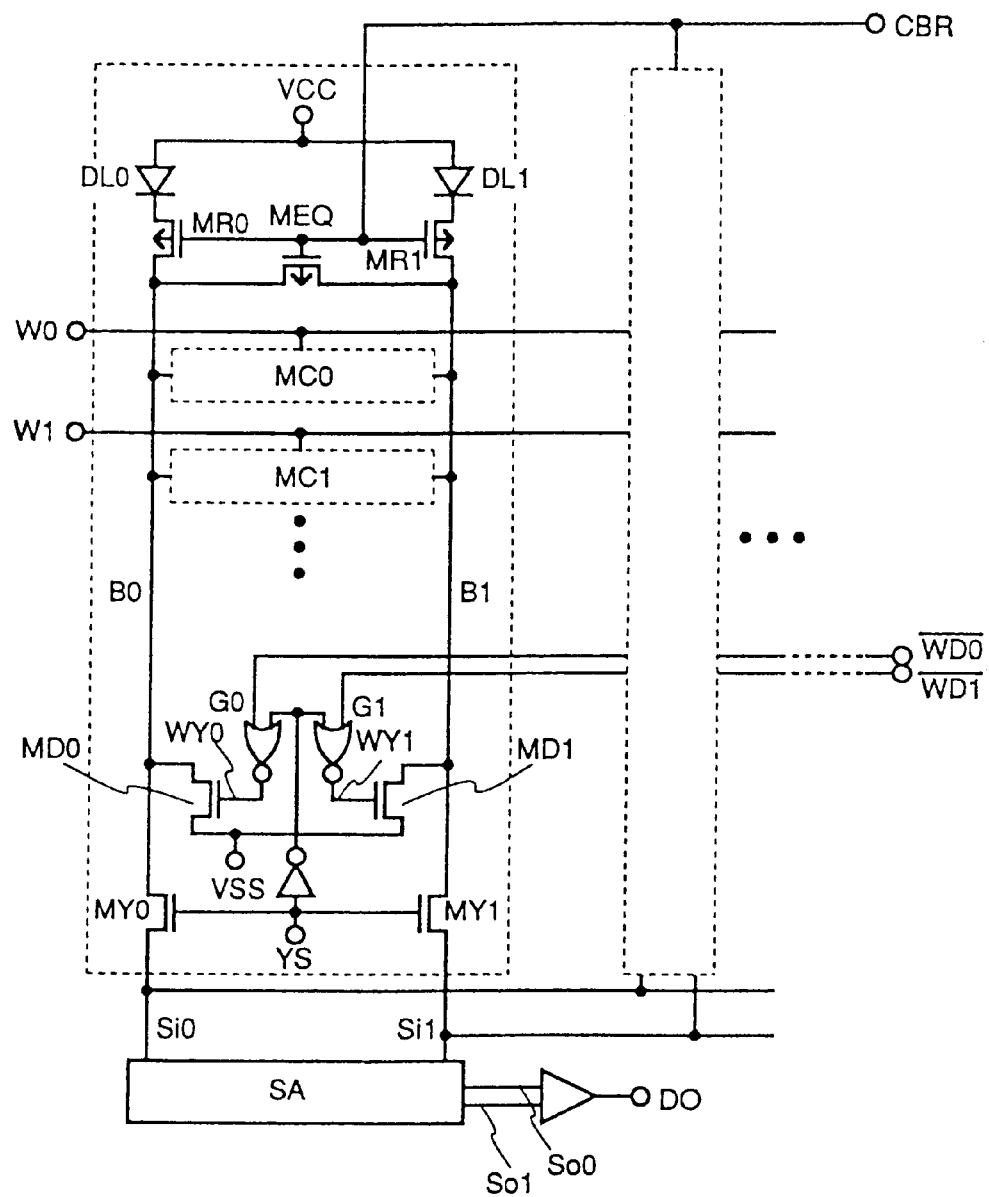
FIG. 7 is a circuit diagram of a semiconductor memory practiced as a third embodiment of the invention.

FIG. 7 is a circuit diagram of a semiconductor memory practiced as the third embodiment of the invention. This is an example in which each bit line is furnished with a bit line pull-down circuit composed of transistors MD0 and MD1.

In the first embodiment of FIG. 1, the bit lines were pulled down by a bit line pull-down circuit (of transistors MD0 and MD1) via switch transistors MY0 and MY1. In that case, the two transistors (MY0 and MD0) were connected in series. This made it difficult to shorten the pull-down time.

In the third embodiment, by contrast, the transistors MD0 and MD1 are connected directly to the bit lines. The transistors MD0 and MD1 are made to conduct and not to conduct by output signals WY0 and WY1 of NOR circuits G0 and G1. The NOR circuits G0 and G1 receive a bit line select signal YS and write signals /WD0 and /WD1 (/X denotes an inverted signal of X).

In the above setup, the bit lines are pulled down not by the two transistors MY0 and MD0 but by the single transistor MD0. This translates into a significant reduction in the pull-down time, whereby the write cycle time is shortened.

Fourth Embodiment

Figure 8:
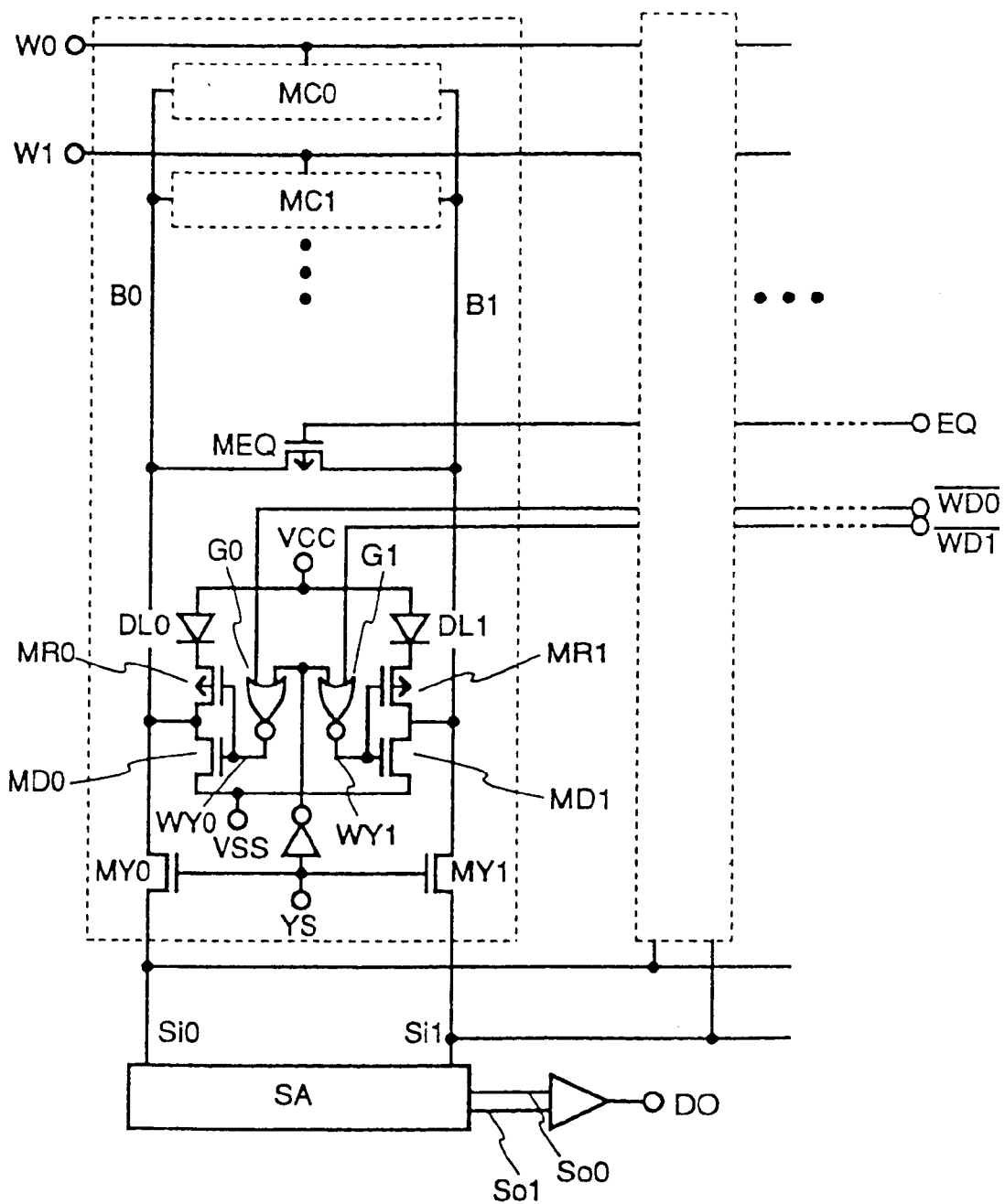
FIG. 8 is a circuit diagram of a semiconductor memory practiced as a fourth embodiment of the invention.

FIG. 8 is a circuit diagram of a semiconductor memory practiced as the fourth embodiment of the invention. This is an example in which the control signal for the transistors MR0 and MR1 is made the same as that for the transistors MD0 and MD1.

As shown in the operation waveform chart of FIG. 5, the control signal CBR for the transistors MR0 and MR1 is timed inherently in the same manner as the control signals WD0 and WD1 for the transistors MD0 and MD1. In that sense, there is no operational problem in the use of a common control signal for the four transistors involved.

A control signal EQ for driving the Equalizing transistor MEQ may be the same as the control signal CBR in FIG. 5. If the gate width and gate potential of the transistor MEQ are designed appropriately, no large through current will flow via the transistor MEQ during a write operation without the transistor MEQ being specifically prevented from conducting. This means that the control signal EQ may be a direct-current signal.

Fifth Embodiment

Figure 9:
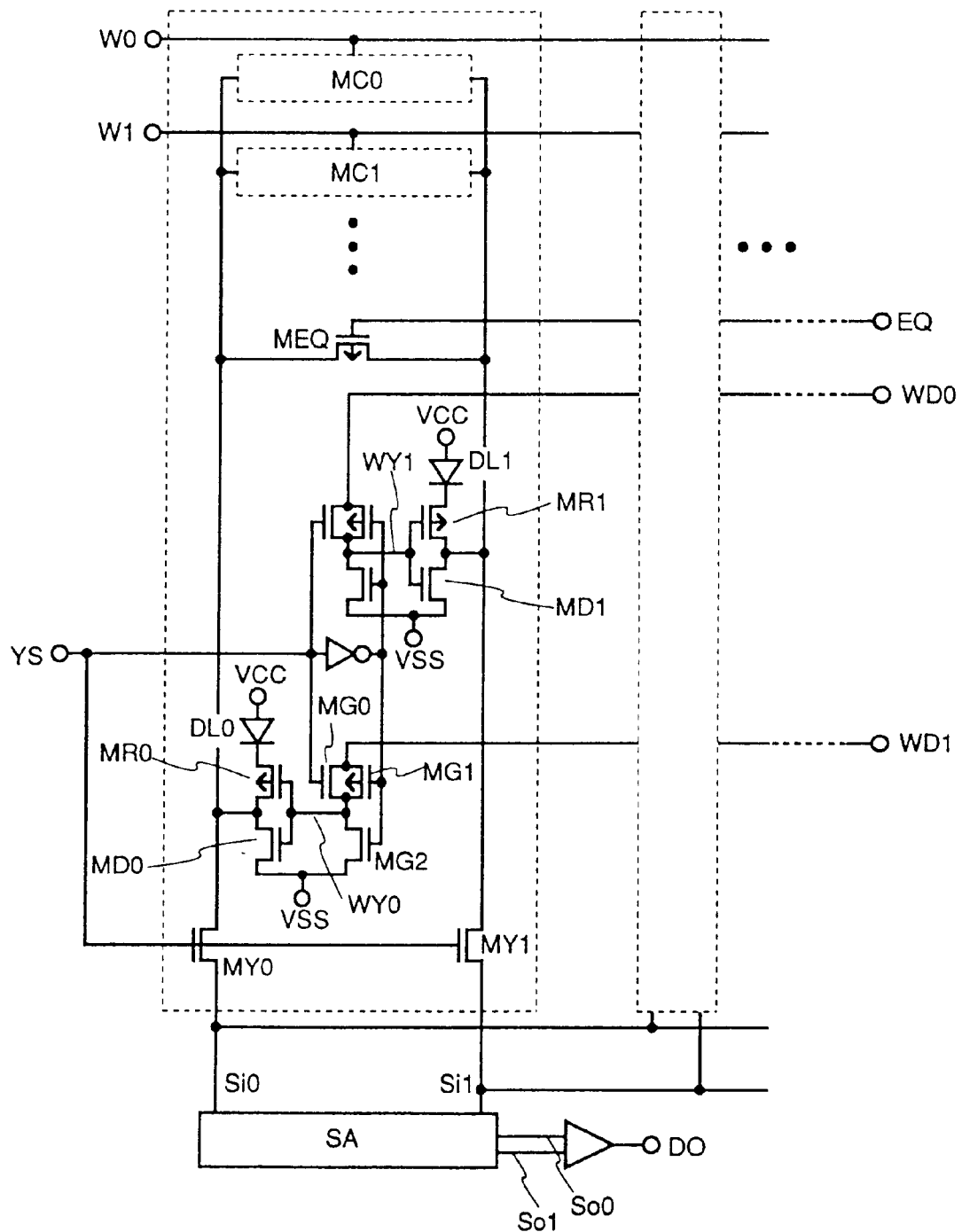
FIG. 9 is a circuit diagram of a semiconductor memory practiced as a fifth embodiment of the invention.

FIG. 9 is a circuit diagram of a semiconductor memory practiced as the fifth embodiment of the invention. The fifth embodiment differs from the fourth embodiment of FIG. 8 in terms of the circuit for generating the control signals WY0 and WY1.

In the setup of FIG. 8, NOR circuits are used to generate the control signals WY0 and WY1. Because NOR circuits require serially connecting pMOS transistors of small driving performance, the gate width of these transistors need to be enlarged appreciably. This necessitates enlarging the circuit area.

In view of these considerations, the fifth embodiment replaces the NOR circuits with transistors MG0, MG1 and MG2. The path transistors MG0 and MG1 make up a switch. When the bit line select signal YS is High (in selected state), the switch outputs WD0 as the control signal WY0. That is, at the time of a write operation (with WD0 High), the transistor MD0 conducts to drive the bit lines Low. In a read operation (with WD0 Low), the transistor MR0 conducts to load the bit lines.

If the bit line select signal YS is Low (in unselected state), the transistor MG2 conducts to output the low potential level as the control signal WY0. The transistor MR0 conducts regardless of the state the write signal WD0 is in, and no data is written to the bit lines.

As described, using path transistors to constitute a circuit eliminates serial connection of pMOS transistors. This allows transistors of small sizes to achieve high-speed performance, which circumvents the disadvantages of the fourth embodiment in FIG. 8.

Sixth Embodiment

Figure 10:
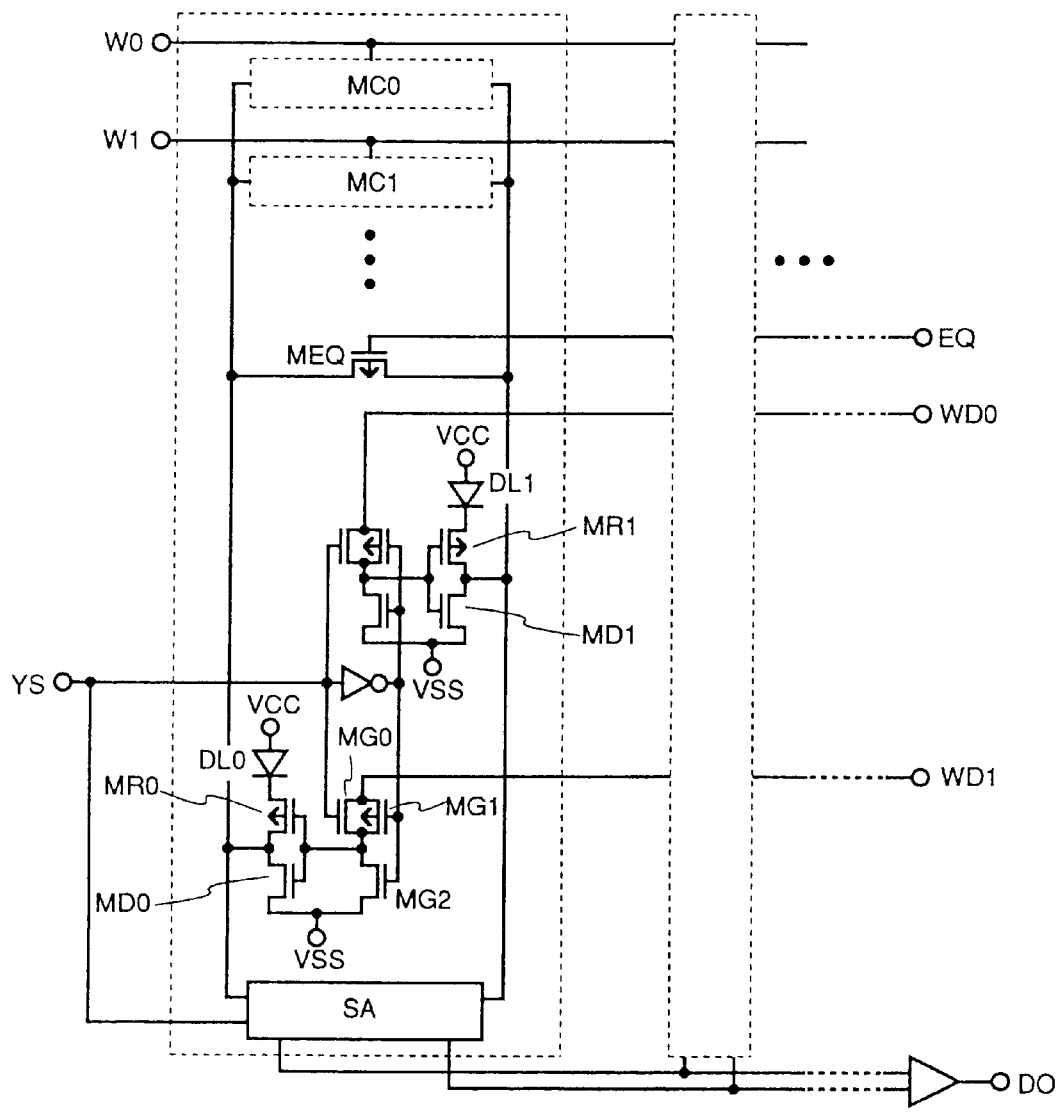
FIG. 10 is a circuit diagram of a semiconductor memory practiced as a sixth embodiment of the invention.

FIG. 10 is a circuit diagram of a semiconductor memory practiced as the sixth embodiment of the invention. In the sixth embodiment, each bit line is furnished with a sense amplifier SA and dispenses with the switch transistors MY0 and MY1. In this constitution, the sixth embodiment reduces the access time by the amount of time in which the signal would otherwise pass through the switch transistors MY0 and MY1.

Figure 11:
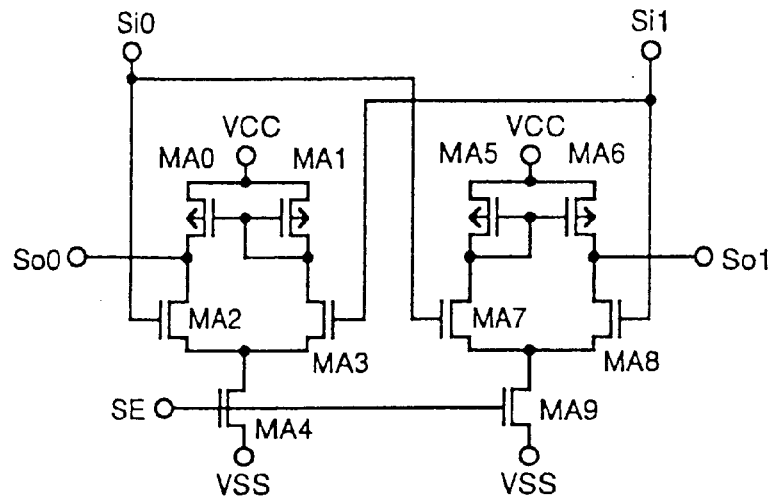
FIG. 11 is a circuit diagram of a conventional sense amplifier.

FIG. 11 is a circuit diagram of a conventional sense amplifier for use with the first through the fifth embodiments. Transistors MA0, MA1, MA2, MA3 and MA4 constitute a current mirror type differential amplifier. When a sense amplifier activate signal SE is brought High, the differential amplifier amplifies the difference between input signals Si0 and SE1 and generates an output signal So0. Transistors MA5, MA6, MA7, MA8 and MA9 make up another differential amplifier that admits in an inverted fashion the input signals of the other differential amplifier.

The setup above provides a complementary signal So1 relative to the output signal So0. The output signals So0 and So1 are output as a data output DO through an output buffer. If the gains of the differential amplifiers are too small to permit a sufficient amplitude for the output signals So0 and So1, yet another differential amplifier may be added for further amplification. After being additionally amplified, the data output may be sent to the output buffer.

Figure 12:
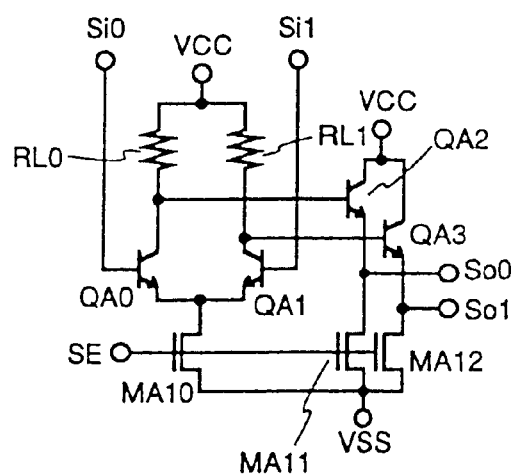
FIG. 12 is a circuit diagram of another conventional sense amplifier.

FIG. 12 is a circuit diagram of another conventional sense amplifier for use with the first through the fifth embodiments. Bipolar transistors QA0 and QA1, resistors RL0 and RL1, and an MOS transistor MA10 constitute a differential amplifier. When the sense amplifier activate signal SE is driven High, the differential amplifier amplifies the difference between the input signals Si0 and Si1. Bipolar transistors QA2 and QA3, and MOS transistor MA11 and MA12 make up an emitter follower for lowering the output impedance. If a sufficiently small load is connected to the output terminal, the emitter follower may be omitted.

If the potential of the input signals Si0 and Si1 is high and if the bipolar transistors QA0 and QA1 operate in a saturation region, then the input signals Si0 and Si1 may be input to the differential amplifier through the emitter follower or via a suitable level shift circuit.

As described, the present embodiment uses bipolar transistors to constitute its sense amplifiers. The result is a high-gain, wide-band sense amplifier arrangement that promises a significantly reduced access time.

Figure 13:
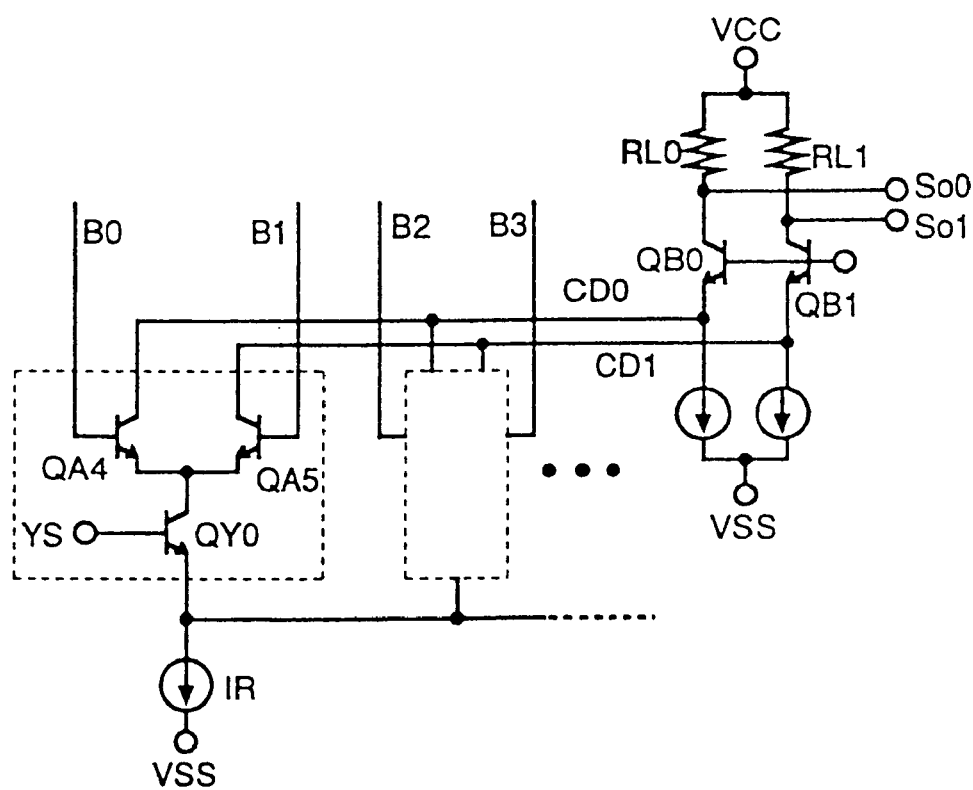
FIG. 13 is a circuit diagram of yet another conventional sense amplifier.

FIG. 13 is a circuit diagram of yet another conventional sense amplifier for use with the sixth embodiment. A differential amplifier furnished to each bit line is constituted by bipolar transistors QA4, QA5 and QY0. The collectors of the amplifying transistors QA4 and QA5 are connected to common data lines CD0 and CD1.

When the bit line select signal YS is driven High, the transistor QY0 conducts. This allows a driving current IR to be fed to the transistors QA4 and QA5.

The potential difference between the bit lines B0 and B1 is amplified by the differential amplifier made of the transistors QA4 and QA5. The amplified potential difference is output as a current signal onto the common data lines CD0 and CD1. The current signal is converted to a voltage signal by load resistors RL0 and RL1 past common base transistors QB0 and QB1 before being output.

The common data lines CD0 and CD1 are connected to numerous differential amplifiers. This structure entails a considerable amount of parasitic capacity. But the signals amplified by the differential amplifiers propagate as current signals, with the result that the voltage amplitude on the common data lines CD0 and CD1 is as small as tens of mV. This makes it possible to minimize the time required to charge and discharge the parasitic capacity, allowing the signals to be output at high speed.

Seventh Embodiment

Figure 14:
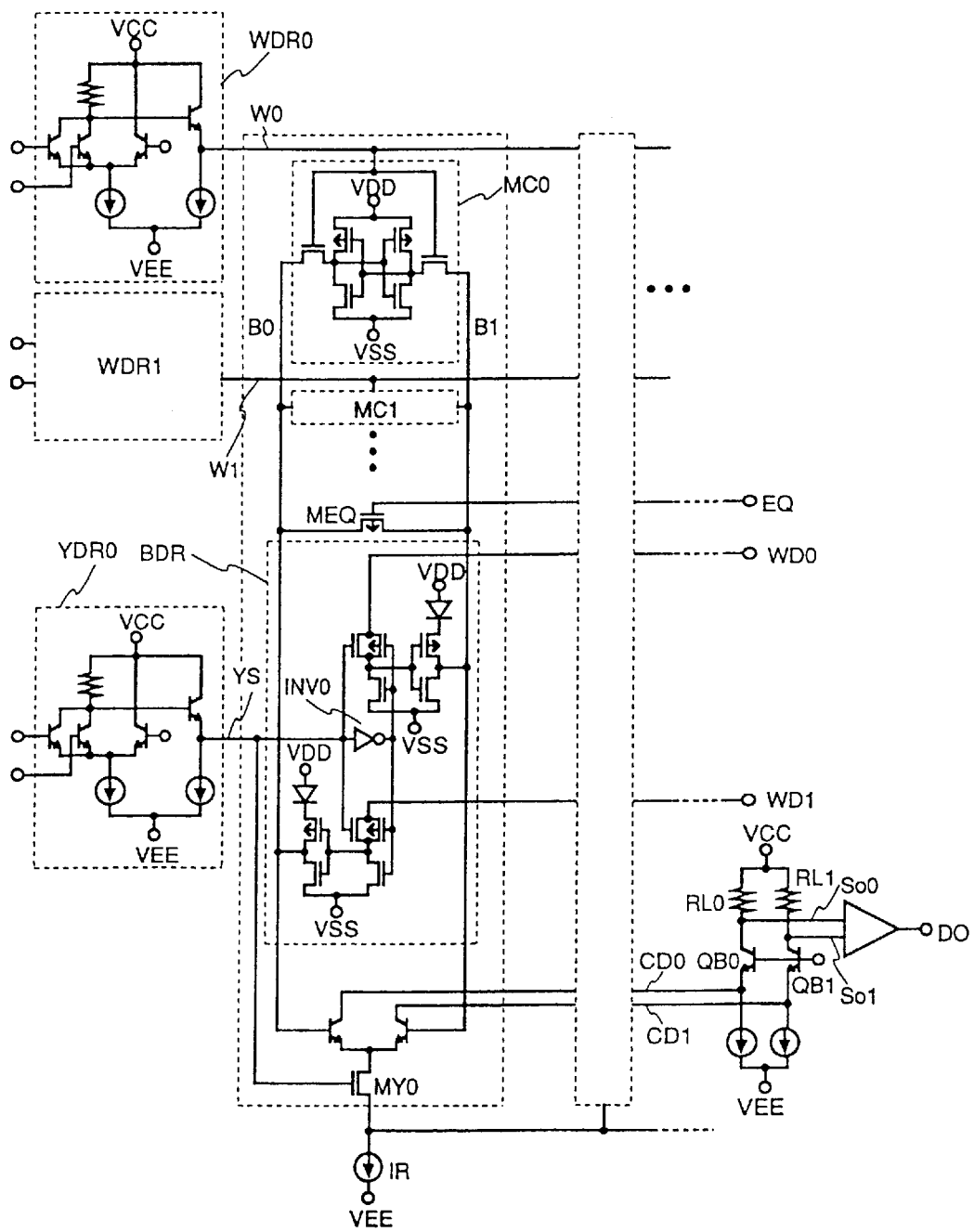
FIG. 14 is a circuit diagram of a semiconductor memory practiced as a seventh embodiment of the invention.

FIG. 14 is a circuit diagram of a semiconductor memory practiced as the seventh embodiment of the invention. This is a semiconductor memory that combines memory cells and peripheral circuits using MOS transistors, with ECL (emitter-coupled logic) peripheral circuits adopting bipolar transistors.

The supply voltages for each memory cell and a bit line driving circuit BDR are VDD and VSS, while the supply voltages for ECL peripheral circuits are VCC and VEE. Illustratively, the potential VDD is set for −0.7 V, VSS for −2.7 V, VCC for 0 V, and VEE for −4 V. The supply voltages VDD and VSS may be either furnished from outside the chip or derived from the supply voltages VCC and VEE using suitable power supply circuits.

Word drivers WDR0 and WDR1 receive signals from an X predecoder (not shown) to drive the word lines High at −0.7 V and Low at −2.7 V. Because the supply voltage for CMOS circuits (VDD−VSS) is −2 V, i.e., lower than that for the ECL circuits (VCC−VEE), the ECL circuits and CMOS circuits may be connected directly without intervention of a level converting circuit.

A Y driver YDR0 receives the output of a Y predecoder (not shown) to generate the bit line select signal YS. The bit line select signal YS is driven High at −0.7 V and Low at −2.7 V. As with the word drivers, the ECL circuits and CMOS circuits may be connected directly without intervention of a level converting circuit.

The seventh embodiment, as described, has its decoders composed of ECL circuits and has its memory cells and its bit line driving circuits made of CMOS circuits. The arrangement realizes a high-performance SRAM that combines the high speed of ECL circuits with the high integration of CMOS circuits.

Although the seventh embodiment utilizes ECL NOR circuits as its word drivers, this is not limitative of the invention. It is also possible to use ECL decoder/driver circuit with a BiCMOS inverter discussed in the IEEE Journal of Solid-State Circuits, Vol. 30, No. 4, April 1995, pp. 491–499. Adopting this type of decoder consumes much less power than using ECL NOR circuits, as is the case with the seventh embodiment.

Figure 15:
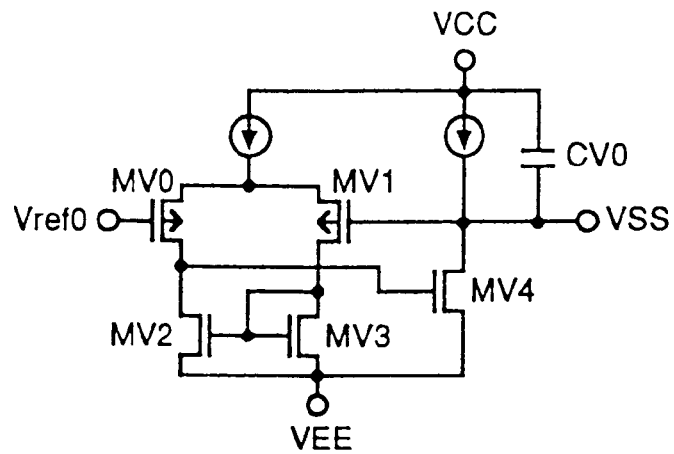
FIG. 15 is a circuit diagram of a conventional power supply circuit.

FIG. 15 is a circuit diagram of a conventional power supply circuit for generating the VSS potential based on the supply voltages VCC and VEE. MOS transistors MV0, MV1, MV2 and MV3 constitute a current mirror type differential amplifier. The output of the differential amplifier propagates through the gate and drain of the MOS transistor MV4 and is fed back to the gate of the MOS transistor MV1, i.e., an input of the amplifier.

The drain of the MOS transistor MV4 is an output terminal VSS. The gate of the MOS transistor MV0, another input of the differential amplifier, is supplied with a reference voltage Vref0. The reference voltage Vref0 is set for the same level as the VSS potential (e.g., −2.7 V) With negative feedback in effect, the power supply circuit works to keep the output VSS potential equal to the reference voltage Vref0.

Illustratively, if the potential of the VSS terminal is made higher than the reference voltage Vref0 for some reason, then a larger current flows to the transistor MNF0, which boosts the gate potential of the transistor MV4. This increases the current flowing to the transistor MV4, and reduces the potential of the VSS terminal to the reference voltage Vref0.

If the potential of the VSS terminal is made lower than the reference voltage Vref0, the workings above are reversed. This raises the potential of the VSS terminal. to the reference voltage Vref0.

As described, the power supply circuit of the seventh embodiment generates the VSS potential in a stable fashion. In this setup, a capacity CV0 for stabilizing the circuit operation must be designed carefully with respect to the relation between feedback loop gain and phase. The reference voltage Vref0 may be kept practically unchanged despite power (VEE) changes or temperature fluctuations if a band gap reference voltage circuit or the like is used.

In this manner, generating the supply voltage VSS inside the semiconductor memory chip minimizes those fluctuations in the operating speed which may be caused by supply voltage changes in the CMOS circuits or by temperature fluctuations.

Eighth Embodiment

Figure 16:
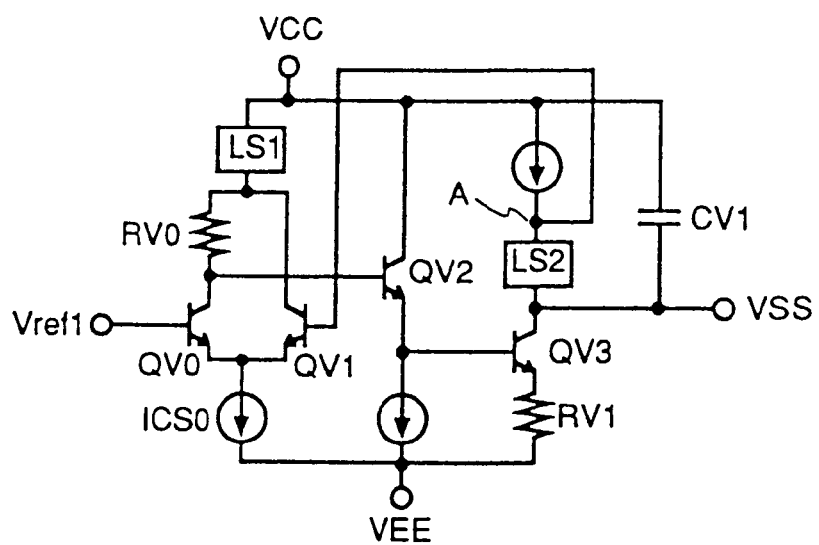
FIG. 16 is a circuit diagram of a semiconductor memory practiced as an eighth embodiment of the invention.

FIG. 16 is a circuit diagram of a semiconductor memory practiced as the eighth embodiment of the invention. This is another power supply circuit that generates the VSS potential based on the supply voltages VCC and VEE. The difference between the eighth embodiment and the power supply circuit of FIG. 15 lies in the use of bipolar transistors.

Bipolar transistors QV0, QV1 and QV2, a resistor RV0, and a level shift circuit LS1 make up a differential amplifier. The level shift circuit LS1 acts to shift the output potential of the differential amplifier by an appropriate voltage.

In the eighth embodiment, the output of the differential amplifier propagates through the base and collector of the bipolar transistor QV3 as well as the level shift circuit LS2. The amplifier output is then fed back to the base of the bipolar transistor QV1, i.e., an input of the differential amplifier.

The collector of the bipolar transistor QV3 is an output terminal VSS. The base of the bipolar transistor QV0, another input of the differential amplifier, is supplied with a reference voltage Vref1.

For the eighth embodiment, the reference voltage Vref1 is set to be higher than the necessary VSS potential by the amount of a level shift performed by the level shift circuit LS2. The reference voltage Vref1 in the eighth embodiment is set differently from that in the circuit of FIG. 15. The reason for this is as follows: suppose that the reference voltage Vref1 is given as −2.7 V and that the supply voltage VEE is lowered by 10%. In that case, the voltage applied to a current source ICS0 is about 0.1 V. That is, the current value is so diminished that a constant current characteristic can no longer be maintained.

With the eighth embodiment, the feedback signal is derived not from the terminal VSS but from a point A having a potential level higher than the VSS potential. This arrangement improves the constant current characteristic of the current source ICS0, allowing the VSS potential to be generated in a stable fashion. If the necessary VSS potential level is high enough to be used directly as the reference voltage, the level shift circuit LS2 may be omitted.

If the power supply circuit is constituted by bipolar transistors as is the case with the eighth embodiment, the feedback loop bandwidth may be made wider than that in the circuit of FIG. 15. This makes it possible to enhance responsiveness to transient fluctuations in tie VSS potential. That is, even if the semiconductor memory is driven in high-speed cycles, fluctuations in the VSS potential may be minimized.

The eighth embodiment is an example in which the emitter of the bipolar transistor QV3 is connected to a resistor RV1. Alternatively, the resistor RV1 may be removed and the emitter of the bipolar transistor QV3 may be connected directly to the VEE terminal depending on the load connected to the VSS terminal or on the differential amplifier characteristics.

The amount of the level shift executed by the level shift circuit LS1 may be varied depending on the supply voltage VEE. This allows the potential VSS to be supplied in an even stable manner.

Ninth Embodiment

Figure 17:
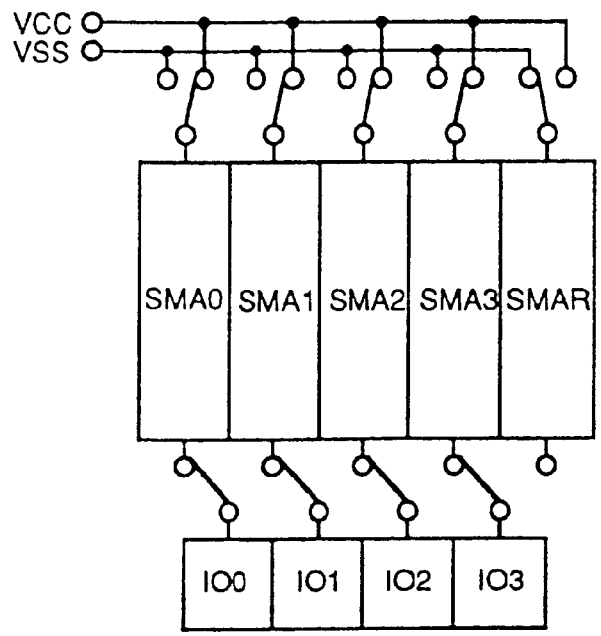
FIG. 17 is a block diagram depicting principles of shift redundancy.
Figure 18:
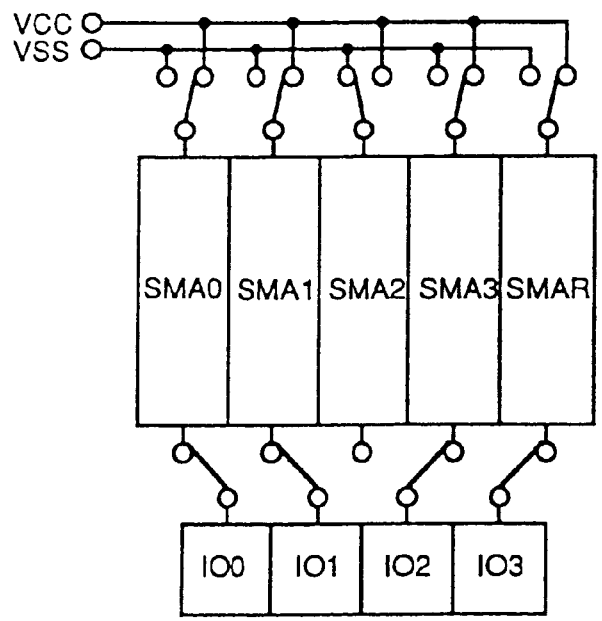
FIG. 18 is another block diagram also illustrating principles of shift redundancy.

What follows is a description of the ninth embodiment of this invention which incorporates shift redundancy arrangements. Principles of shift redundancy are first outlined. FIGS. 17 and 18 are block diagrams depicting principles of shift redundancy. In the example introduced here, each memory cell array is divided into four sub-arrays SMA0, SMA1, SMA2 and SMA3 (called normal sub-arrays hereunder). Each normal sub-array is furnished with input/ output circuits IO0, IO1, IO2 and IO3. A spare sub-array SMAR is provided to replace a normal sub-array that may develop a failure. Input/output terminals of and power supplies to the sub-arrays are switched over by appropriate switches. For purpose of simplification and illustration, such circuits as address buffers and decoders are omitted from FIGS. 17 and 18.

If normal sub-arrays are free of fault, the sub-arrays SMA0 through SMA3 have their power supply terminals connected to the potential VCC to supply power to the memory cell in question. The normal sub-arrays SMA0 through SMA3 are connected respectively to the input/output circuits IO0 through IO3 so that data may be written to and read from these normal sub-arrays. The spare sub-array is disconnected from the input/output circuits, and the power supply terminal of the spare sub-array is short-circuited to the potential VSS.

Suppose that the normal sub-array SMA2 has developed a failure. In that case, as shown in FIG. 18, the switches of the input/output circuits IO0 and IO1 remain connected to the normal sub-arrays SMA0 and SMA1. The switches of the input/output circuits IO2 and IO3 are shifted right one place and connected to the normal sub-array SMA 3 and spare sub-array SMAR. At the same time, the power supply terminal of the normal sub-array SMA2 is connected to the: potential VSS to disconnect power from the normal sub-array SMA2. These settings allow the spare sub-array to take the place of the faulty sub-array, bypassing the failure. In this example, power to the defective sub-array is cut off to prevent extra power dissipation if the power supply terminals VCC and VSS are short-circuited in the failed sub-array or if any of the transistors making up the memory cell has developed a leak or other fault.

The above kind of shift redundancy is discussed illustratively in the IEEE Journal of Solid-State Circuits, Vol. 26, No. 4, April 1991, pp. 507–511.

As described, to implement shift redundancy requires furnishing the sub-arrays with an input/output circuit switching function and a function for cutting off power. Of these functions, the input/output circuit switching function may be realized illustratively by adopting techniques discussed in the above-cited publication. The power cutoff function may be implemented through the use of circuits shown in FIG. 19.

Figure 19:
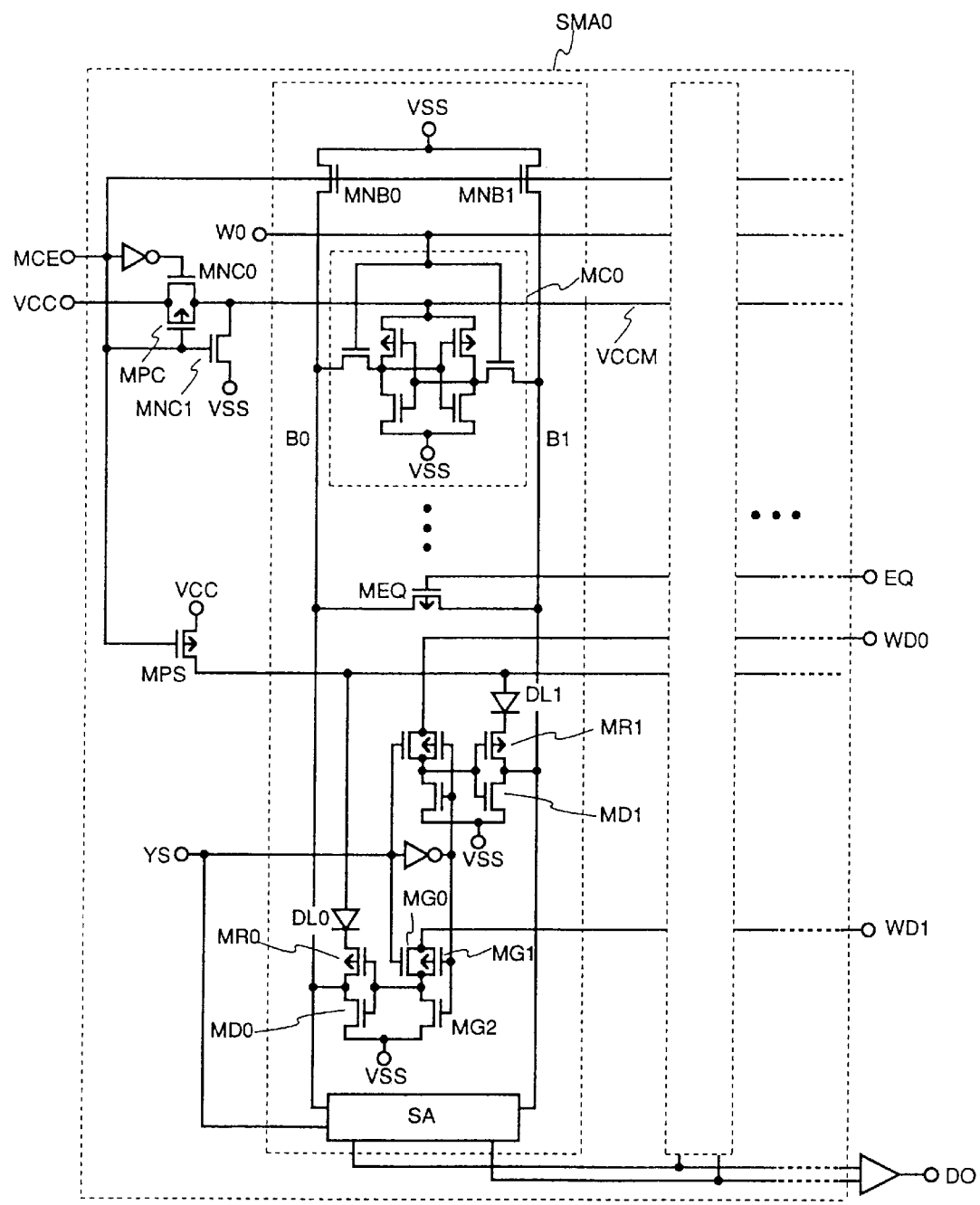
FIG. 19 is a circuit diagram of a semconductor memory which implements a power cut off function practiced as a ninth embodiment of the invention.

Introduced anew in the setup of FIG. 19 are a memory cell power cutoff switch made of transistors MNC0, MNC1 and MPC; a switch constituted by transistors MNB0 and MNB1 for fixing the bit line potential to VSS; and a bit line recovery circuit power cutoff switch composed of a transistor MPS. The other components are the same as those in the sixth embodiment of FIG. 10.

If no sub-array is faulty, a redundancy control signal MCE is held Low; the transistors MPC, MNC0 and MPS conduct; and the supply voltage VCC is fed to the memory cell and bit line recovery circuit. The transistors MNB0 and MNB1 remain nonconductive so as not to impede read and write operations. These settings allow the sub-arrays to function normally.

If a sub-array has developed a failure, the redundancy control signal MCE is brought High to disconnect the supply voltage VCC from the memory cell and bit line recovery circuit. The transistors MNC1, MNB0 and MNB1 conduct, and a high potential supply terminal VCCM of the memory cell and the bit lines B0 and B1 are short-circuited to the potential VSS. This leaves no bias between the gates, sources and drains of the transistors within the memory cell, which inhibits extra power dissipation that would otherwise be caused by such irregularities as leaks through the faulty memory cell.

As described, incorporating a small number of additional transistors makes it possible to implement the power cutoff function applicable to shift redundancy.

Tenth Embodiment

Figure 20:
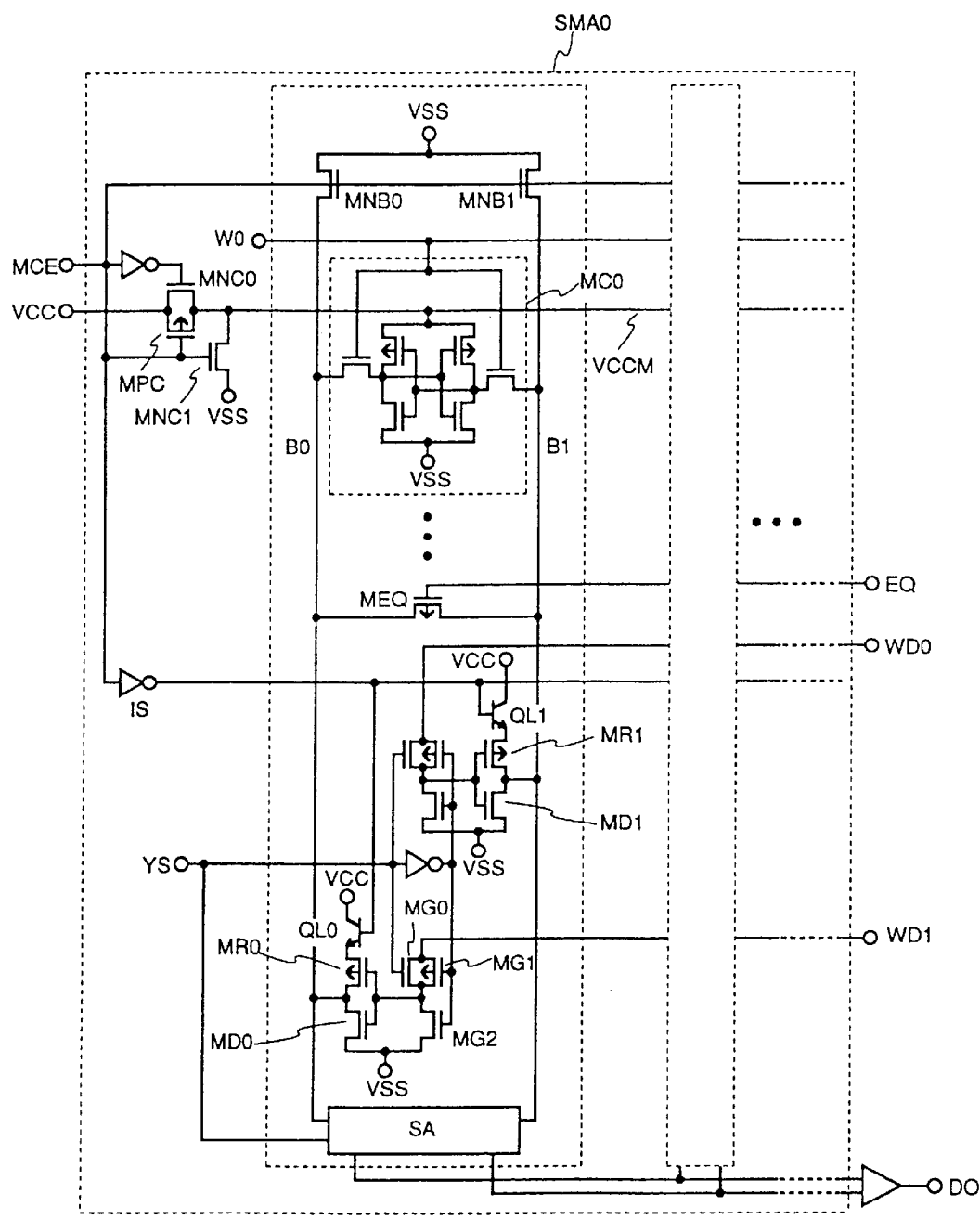
FIG. 20 is a circuit diagram of a semiconductor memory which implements a power cut off function practiced as a tenth embodiment of the invention.

FIG. 20 is a circuit diagram of a semiconductor memory practiced as the tenth embodiment of the invention wherein a variation of the above-mentioned power cutoff function is implemented. That is, the tenth embodiment has a recovery circuit power cutoff method different from that in the setup of FIG. 19. In the example of FIG. 19, if no sub-array is defective, the charging current for bit line recovery flows through the transistor MPS before reaching the bit lines. That is, the gate of the transistor MPS is made sufficiently wide to reduce the equivalent resistance, whereby high-speed bit line recovery is implemented. This necessarily increases the sub-array area.

In the tenth embodiment, the diodes DL0 and DL1 are replaced by bipolar transistors QL0 and QL1. The collectors of the transistors QL0 and QL1 are connected to the supply voltage VCC, and their bases are connected to an inverted signal of the redundancy control signal MCE. In the absence of a fault, the inverted signal of the redundancy control signal MCE is driven High (VCC) and the bit line recovery circuit operates normally. At this point, the charging current for bit line recovery is supplied by a current amplifying function of the transistors QL0 and QL1. More specifically, most of the charging current is supplied from the collectors of the transistors QL0 and QL1 connected to the potential VCC. This leaves little current flowing to the transistor inside an inverter IS, allowing the gate width of the MOS transistor constituting the inverter IS to be reduced. In this manner, it is possible to implement the power cutoff function while minimizing any increase in the sub-array area.

Although the two embodiments of FIGS. 19 and 20 are modifications of the embodiment in FIG. 10, the latter being supplemented by the power cutoff function when modified, this is not limitative of the invention. Other embodiments may also be furnished additionally with a power cutoff function of similar constitution.

As described, the inventive structures eliminate the need for timing margins to be interposed conventionally between the write signal WD0 and the control signal CBR. The structures of the invention also shorten the time for bit line recovery. As a result, the cycle time is made drastically shorter than before.

As many apparently different embodiments of this invention may be made without departing from the spirit and scope thereof, it is to be understood that the invention is not limited to the specific embodiments thereof except as defined in the appended claims.

What is claimed is:

1. A semiconductor memory comprising:
   a plurality of word lines;
   a plurality of bit line pairs;
   a plurality of memory cells formed at points of intersection between said word lines and said bit line pairs;
   a word decoder for generating a word line select signal upon receipt of an address signal;
   a bit decoder for generating a bit line select signal upon receipt of said address signal;
   a bit line load circuit for receiving a signal current from an applicable one of the memory cells;

a sense circuit for detecting an output signal from said bit line load circuit; and a bit line pull-down circuit and a bit line recovery circuit for driving the applicable bit lines at the time of writing data to a memory cell to be written;

wherein said bit line load circuit and said bit line recovery circuit include pMOS transistors which have drains thereof connected to the bit lines and which have gates thereof fed with a control signal, and diodes which have anodes thereof connected to a first power supply and which have cathodes thereof connected to sources of said pMOS transistors, said pMOS transistors and said diodes being furnished to each of said bit line pairs; and wherein said PMOS transistors are inhibited from conducting while the bit lines are being driven Low by said bit line pull-down circuit during a write cycle, and allowed to conduct during other periods including a real cycle.

2. A semiconductor memory according to claim 1, wherein said bit line load circuit and said bit line recovery circuit further include a logic circuit which receives a write signal and said bit line select signal and which generates said control signal;

wherein said bit line pull-down circuit comprises nMOS transistors which are furnished to each of said bit line pairs, which have drains thereof connected to the bit lines, which have gates thereof fed with said control signal, and which have sources thereof connected to a second power supply.

3. A semiconductor memory according to claim 2, wherein said logic circuit is constituted by a switching circuit which has an input terminal thereof fed with said write signal and which has an output terminal thereof connected to the gates of said pMOS and said nMOS transistors, said switching circuit outputting said write signal when said bit line select signal is in a selected state, said switching circuit further having the output thereof fixed to a low potential when said bit line select signal is in an unselected state.

4. A semiconductor memory according to claim 2, wherein said second power supply is provided by a power supply circuit included in a semiconductor memory chip.

5. A semiconductor memory according to claim 4, wherein said power supply circuit comprises:

bipolar transistors which have collectors thereof connected to said second power supply and which have emitters thereof connected to a third power supply either directly or through resistors;

a level shift circuit which has a first terminal thereof connected to the collectors of said bipolar transistors and which has a second terminal thereof connected to a current source;

a differential amplifier which is connected interposingly between said first power supply and said third power supply, which has a first terminal thereof connected to a reference voltage and a second terminal thereof connected to said second terminal of said level shift circuit, and which has an output terminal thereof connected to bases of said bipolar transistors; and a capacitive element connected interposingly between said first power supply and said second power supply.

6. A semiconductor memory according to claim 1, wherein either said word decoder or said bit decoder includes an ECL circuit.

7. A semiconductor memory according to claim 1, further comprising a first, a second and a third element for use if a memory cell array develops a fault, said first element cutting off the supply of power to the memory cell of the faulty memory cell array, said second element fixing the bit lines to a low power supply potential of said memory cell, and said third element severing connection between the anodes of said diodes and said first power supply.

8. A semiconductor memory according to claim 1, wherein said diodes are constituted by bipolar transistors which have emitters thereof connected to the sources of said pMOS transistors and which have bases thereof connected to a second power supply.

9. A semiconductor memory according to claim 1, wherein said diodes are constituted by bipolar transistors which have bases and collectors thereof interconnected.

10. A semiconductor memory according to claim 1, wherein said diodes are constituted by MOS transistors which have gates and drains thereof interconnected.

11. A semiconductor memory according to claim 1, wherein said diodes are constituted by Schottky-barrier diodes.

12. A semiconductor memory according to claim 8, further comprising a first, a second and a third element for use if a memory cell array develops a fault, said first element cutting off the supply of power to the memory cell of the faulty memory cell array, said second element fixing the bit lines to a low power supply potential of said memory cell, and said third element lowering a base potential of said bipolar transistors to bring about a cutoff state.

13. A semiconductor memory according to claim 4, wherein said power supply circuit comprises:

bipolar transistors which have collectors thereof connected to said second power supply and which have emitters thereof connected to a third power supply either directly or through resistors;

a level shift circuit which has a first terminal thereof connected to the collectors of said bipolar transistors and which has a second terminal thereof connected to a current source;

a differential amplifier which is connected interposingly between said first power supply and said third power supply, which has a first terminal thereof connected to a reference voltage and a second terminal thereof connected to said second terminal of said level shift circuit, and which has an output terminal thereof connected to bases of said bipolar transistors; and a capacitive element connected interposingly between said first power supply and said second power supply;

wherein either said word decoder or said bit decoder includes an ECL circuit.

14. A semiconductor memory according to claim 1, wherein said diodes are constituted by first bipolar transistors which have emitters thereof connected to the sources of said pMOS transistors and which have bases thereof connected to a second power supply;

wherein said bit line load circuit and said bit line recovery circuit further include a logic circuit which receives a write signal and said bit line select signal and which generates said control signal;

wherein said bit line pull-down circuit comprises nMOS transistors which are furnished to each of said bit line pairs, which have drains thereof connected to the bit lines, which have gates thereof fed with said control signal, and which have sources thereof connected to said second power supply;

wherein said second power supply is provided by a power supply circuit included in a semiconductor memory chip;

wherein said power supply circuit comprises:
- second bipolar transistors which have collectors thereof connected to said second power supply and which have emitters thereof connected to a third power supply either directly or through resistors;
- a level shift circuit which has a first terminal thereof connected to the collectors of said second bipolar transistors and which has a second terminal thereof connected to a current source;
- a differential amplifier which is connected interposingly between said first power supply and said third power supply, which has a first terminal thereof connected to a reference voltage and a second terminal thereof connected to said second terminal of said level shift circuit, and which has an output terminal thereof connected to bases of said second bipolar transistors; and
- a capacitive element connected interposingly between said first power supply and said second power supply;

wherein either said word decoder or said bit decoder includes an ECL circuit; and wherein said semiconductor memory further comprises a first, a second and a third element for use if a memory cell array develops a fault, said first element cutting off the supply of power to the memory cell of the faulty memory cell array, said second element fixing the bit lines to a lower power supply potential of said memory cell, and said third element lowering a base potential of said first bipolar transistors to bring about a cutoff state.

* * * * *